(12) United States Patent
Brewster et al.

(10) Patent No.: US 7,256,863 B2
(45) Date of Patent: Aug. 14, 2007

(54) SEALING ASSEMBLY, A LITHOGRAPHIC PROJECTION APPARATUS, AND A DEVICE MANUFACTURING METHOD

(75) Inventors: Barrie Dudley Brewster, Brighton (GB); Robert Gordon Livesey, Haywards Heath (GB); Johannes Henricus Wilhelmus Jacobs, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 162 days.

(21) Appl. No.: 10/875,511

(22) Filed: Jun. 25, 2004

(65) Prior Publication Data
US 2005/0052631 A1    Mar. 10, 2005

(30) Foreign Application Priority Data
Jun. 27, 2003    (EP) ................................ 03077014

(51) Int. Cl.
*G03B 27/52* (2006.01)
*G03B 27/42* (2006.01)
(52) U.S. Cl. .......................................... 355/30; 355/53
(58) Field of Classification Search .................. 355/30, 355/53, 72–76
See application file for complete search history.

(56) References Cited

U.S. PATENT DOCUMENTS

| 4,118,042 A | 10/1978 | Booth |
| 6,222,609 B1 * | 4/2001 | Nishimura ................... 355/30 |
| 6,333,775 B1 * | 12/2001 | Haney et al. ................. 355/30 |
| 6,600,547 B2 * | 7/2003 | Watson et al. ............... 355/30 |
| 6,740,891 B2 * | 5/2004 | Driessen et al. ......... 250/492.1 |
| 2003/0058426 A1 | 3/2003 | Watson et al. |
| 2005/0028314 A1 * | 2/2005 | Hickman et al. ............. 15/302 |

FOREIGN PATENT DOCUMENTS

| EP | 0 295 616 A2 | 12/1988 |
| EP | 1 306 592 A2 | 5/2003 |
| WO | WO 01/84241 A1 | 11/2001 |

* cited by examiner

*Primary Examiner*—Henry Hung Nguyen
(74) *Attorney, Agent, or Firm*—Pillsbury Winthrop Shaw Pittman LLP

(57) ABSTRACT

A sealing assembly for sealing a slit between two regions in a lithographic apparatus is disclosed. The assembly includes a vacuum pumping device that extends substantially in a longitudinal slit direction for at least partially preventing particle transmission in a transversal slit direction.

14 Claims, 2 Drawing Sheets

SEALING ASSEMBLY, A LITHOGRAPHIC PROJECTION APPARATUS, AND A DEVICE MANUFACTURING METHOD

CROSS-REFERENCE TO RELATED APPLICATIONS

This application claims the benefit of priority from European Patent Application No. 03077014.3, entitled "A SEALING ASSEMBLY, A LITHOGRAPHIC PROJECTION APPARATUS, AS WELL AS A DEVICE MANUFACTURING METHOD," filed Jun. 27, 2003, the content of which is incorporated herein by reference in its entirety.

FIELD

The invention relates to a sealing assembly for sealing a slit that separates two parts of a lithographic apparatus. The invention also relates to a device manufacturing method.

BACKGROUND

U.S. Pat. No. 6,333,775, which is incorporated herein by reference, discloses a sealing assembly for use in an EUV lithography apparatus. The assembly is arranged for sealing a respective gap extending between an optics zone and a substrate zone, or a gap between the optics zone and a reticle zone, of the EUV lithography apparatus. The gaps are provided for maintaining different parts of the apparatus vibrationally isolated from each other, particularly to shield the projection optics from environmental vibrations. The sealing assembly serves to seal the respective gap to prevent contamination, emanating from the wafer zone or reticle zone, from transmitting via the gap into the other zones of the apparatus. The seal assemblies serve to maintain the zones at appropriate vacuum pressures.

In U.S. Pat. No. 6,333,775, three different sealing assemblies are proposed for sealing the gaps. A first sealing assembly includes a horizontal seal and a vertical seal which completely close off the gap, so that no particles will be transmitted through the slit. However, a disadvantage of this first assembly is that the two seals provide a relatively stiff connection, which leads to a poor vibration isolation.

In a second embodiment shown in U.S. Pat. No. 6,333,775, the disadvantage is partly removed by the application of a sheet of flexible polymer instead of the horizontal seal. However, such a sheet is relatively stiff in a rotational direction. Therefore, substantially no rotation isolation can be achieved.

A third seal assembly of U.S. Pat. No. 6,333,775 includes a horizontal steel plate, that extends such that the gap is narrowed to 0.008 inch. In this third embodiment, some vibrational isolation of different components of the apparatus can be achieved in all directions. However, the third embodiment can not cope with relatively large vibrations. The small gap is relatively hard to maintain during the full operational life of a industrial vacuum machine. Furthermore, a relatively large amount of particles can be transmitted via such a slit, particularly in case there is a relatively large pressure difference between the zones that are in fluid connection with the slit.

SUMMARY

It is an aspect of embodiments of the invention to improve the sealing of the slit, so that relatively little particles are transmitted via the slit.

According to an embodiment, the sealing assembly includes a sealing device extending substantially in a longitudinal slit direction for at least partially preventing particle transmission in a transversal slit direction.

According to an embodiment, this aspect may be achieved when the sealing device includes a vacuum pumping device The vacuum pumping device can prevent particles to flow in the transversal slit direction. Consequently, a good sealing against particle transmission may be achieved. The slit can be dimensioned relatively wide while being substantially sealed by the vacuum pumping device, for example, to provide a good, long-lasting vibrational isolation with large dimensional tolerances between two parts of a vacuum apparatus.

In an embodiment, a sealing assembly for sealing a slit between two regions in a lithographic apparatus is provided. The assembly includes a vacuum pumping device that extends substantially in a longitudinal slit direction for at least partially preventing particle transmission in a transversal slit direction.

It is an aspect to provide to a lithographic projection apparatus. The apparatus includes at least one vacuum chamber containing: a substrate support for supporting at least one substrate; a patterning device for patterning a projection beam of radiation according to a desired pattern; and a projection device for projecting the patterned projection beam of radiation onto a target portion of the substrate. A first part of the apparatus and a second part of the apparatus are mechanically decoupled from each other by at least one slit.

In an embodiment, the lithographic projection apparatus is characterized in that the slit includes a sealing assembly for sealing the slit. The sealing assembly includes a sealing device that extends substantially in a longitudinal slit direction for at least partially preventing particle transmission in a transversal slit direction. The sealing device includes a vacuum pumping device. This provides the abovementioned advantages to the lithographic apparatus. Particularly, a high degree of mechanical decoupling can be achieved, as well as a good degree of slit sealing.

In an embodiment, A lithographic projection apparatus is provided. The apparatus includes a substrate support for supporting at least one substrate, a patterning device for patterning a beam of radiation according to a desired pattern, and a projection device for projecting the patterned beam of radiation onto a target portion of the substrate. At least a first part of the apparatus and a second part of the apparatus are mechanically decoupled from each other by at least one slit. A vacuum pumping device extends substantially in a longitudinal slit direction for at least partially preventing particle transmission in a transversal slit direction.

Another aspect of the present invention provides a device manufacturing method that includes providing at least one beam of radiation using a radiation system; providing at least one substrate in a vacuum environment, the substrate being at least partially covered by a layer of radiation sensitive material; using a patterning device in a vacuum environment to endow the beam of radiation with a pattern in its cross-section; and using a projection device in a second vacuum environment to project the patterned beam of radiation onto a target portion of the layer of radiation-sensitive material of the substrate. At least a second part of an apparatus is mechanically decoupled from a first part of the apparatus by at least one slit. The slit is sealed by a sealing assembly that includes a vacuum pumping device that extends substantially in a longitudinal slit direction for at least partially preventing particle transmission in a transversal slit direction.

In an embodiment, a method for manufacturing a device on a lithographic apparatus is provided. The method includes patterning a beam of radiation in a first vacuum chamber, and projecting the patterned beam of radiation onto a target portion of a layer of radiation-sensitive material on a substrate located in a second vacuum chamber. A longitudinal slit is disposed between the first vacuum chamber and the second vacuum chamber. The method also includes applying a vacuum to the longitudinal slit to substantially seal the first and second vacuum chambers from one another.

The term "patterning device" as here employed should be broadly interpreted as referring to a device that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such patterning devices include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing a piezoelectric actuation device. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic devices. In both of the situations described hereabove, the patterning device can include one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference. In the case of a programmable mirror array, the support structure may be embodied as a frame or table, for example, which may be fixed or movable as required; and A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper or step and repeat apparatus. In an alternative apparatus—commonly referred to as a step and scan apparatus—each target portion is irradiated by progressively scanning the mask pattern under the projection beam in a given reference direction (the "scanning" direction) while synchronously scanning the substrate table parallel or anti parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation sensitive material (resist). Prior to this imaging step, the substrate may undergo various procedures, such as priming, resist coating and a soft bake. After exposure, the substrate may be subjected to other procedures, such as a post exposure bake (PEB), development, a hard bake and measurement/inspection of the imaged features. This array of procedures is used as a basis to pattern an individual layer of a device, e.g. an IC. Such a patterned layer may then undergo various processes such as etching, ion implantation (doping), metallization, oxidation, chemo mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0 07 067250 4, incorporated herein by reference.

For the sake of simplicity, the projection system may hereinafter be referred to as the "lens"; however, this term should be broadly interpreted as encompassing various types of projection systems, including refractive optics, reflective optics, and catadioptric systems, for example. The radiation system may also include components operating according to any of these design types for directing, shaping or controlling the projection beam, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid crystal display panels, thin film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5-20 nm), as well as particle beams, such as ion beams or electron beams.

Additional embodiments of the invention are described in detail below.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
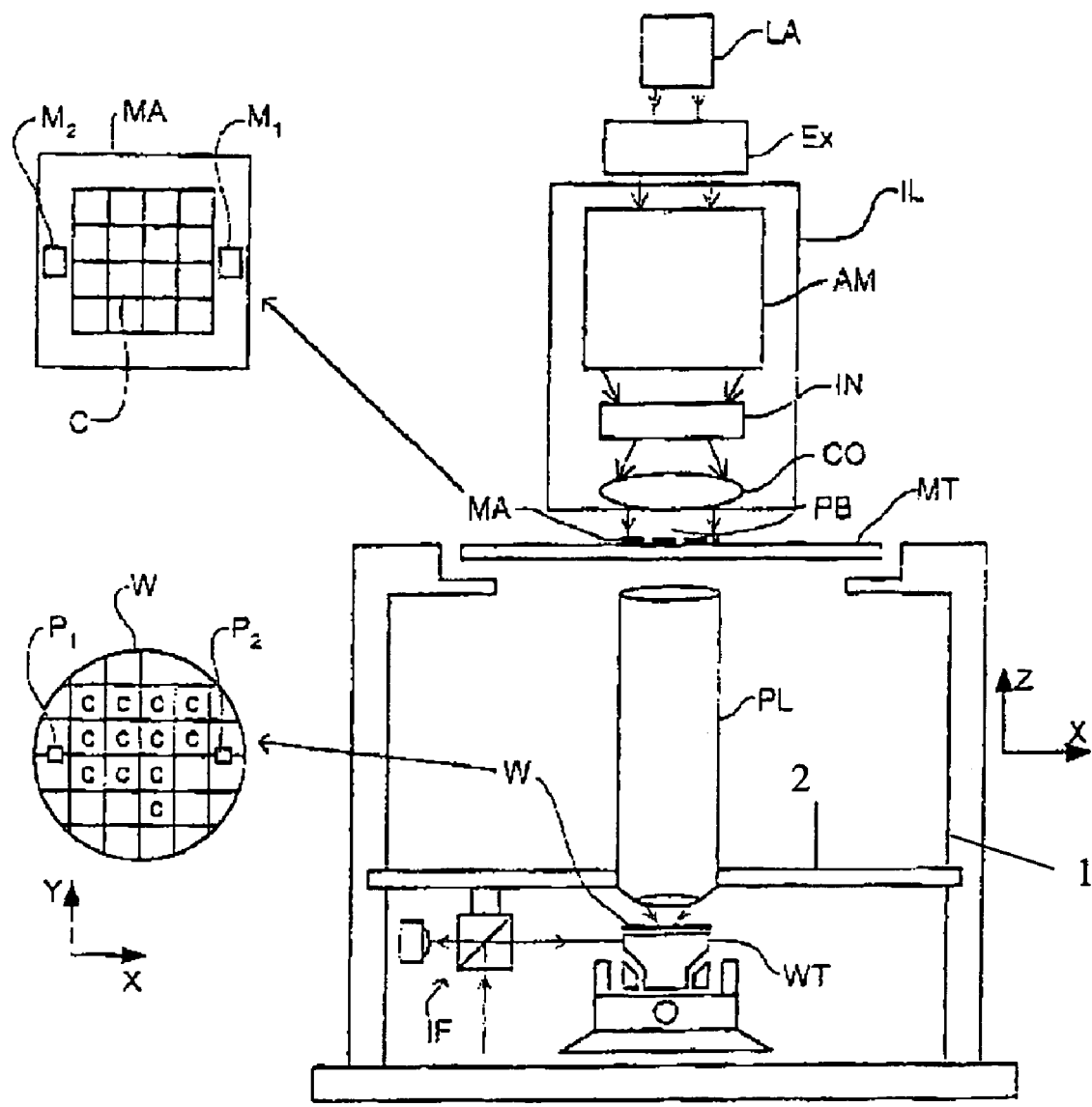
FIG. 1 depicts an embodiment of a lithographic projection apparatus of the present invention.

FIG. 1 schematically depicts a lithographic projection apparatus. The apparatus includes: a radiation system Ex, IL, for supplying a projection beam PB of radiation (e.g. light in the deep ultraviolet region). In this particular case, the radiation system also includes a radiation source LA. A first object table (mask table) MT is provided with a mask holder for holding a mask MA (e.g. a reticle), and is connected to a first positioning device PM for accurately positioning the mask with respect to item PL. A second object table (substrate table) WT is provided with a substrate holder for holding a substrate W (e.g. a resist coated silicon wafer), and is connected to a second positioning device PW for accurately positioning the substrate with respect to item PL. The apparatus also includes a projection system ("lens") PL for imaging an irradiated portion of the mask MA onto a target portion C (e.g. comprising one or more dies) of the substrate W. The projection system PL is mounted on a metro frame 2 which is vibrationally isolated from a base frame 1.

As here depicted, the apparatus is of a transmissive type (i.e. has a transmissive mask). However, in general, it may also be of a reflective type, for example (with a reflective mask). Alternatively, the apparatus may employ another kind of patterning device, such as a programmable mirror array of a type as referred to above.

The source LA (e.g. an excimer laser source) produces a beam of radiation. This beam is fed into an illumination system (illuminator) IL, either directly or after having traversed a conditioning device, such as a beam expander Ex, for example. The illuminator IL may include an adjusting device AM for setting the outer and/or inner radial extent (commonly referred to as σ-outer and σ-inner, respectively) of the intensity distribution in the beam. In addition, it will generally include various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device PW (and an interferometric measuring device IF), the substrate table WT can be moved accurately, so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

1. In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB; and 2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
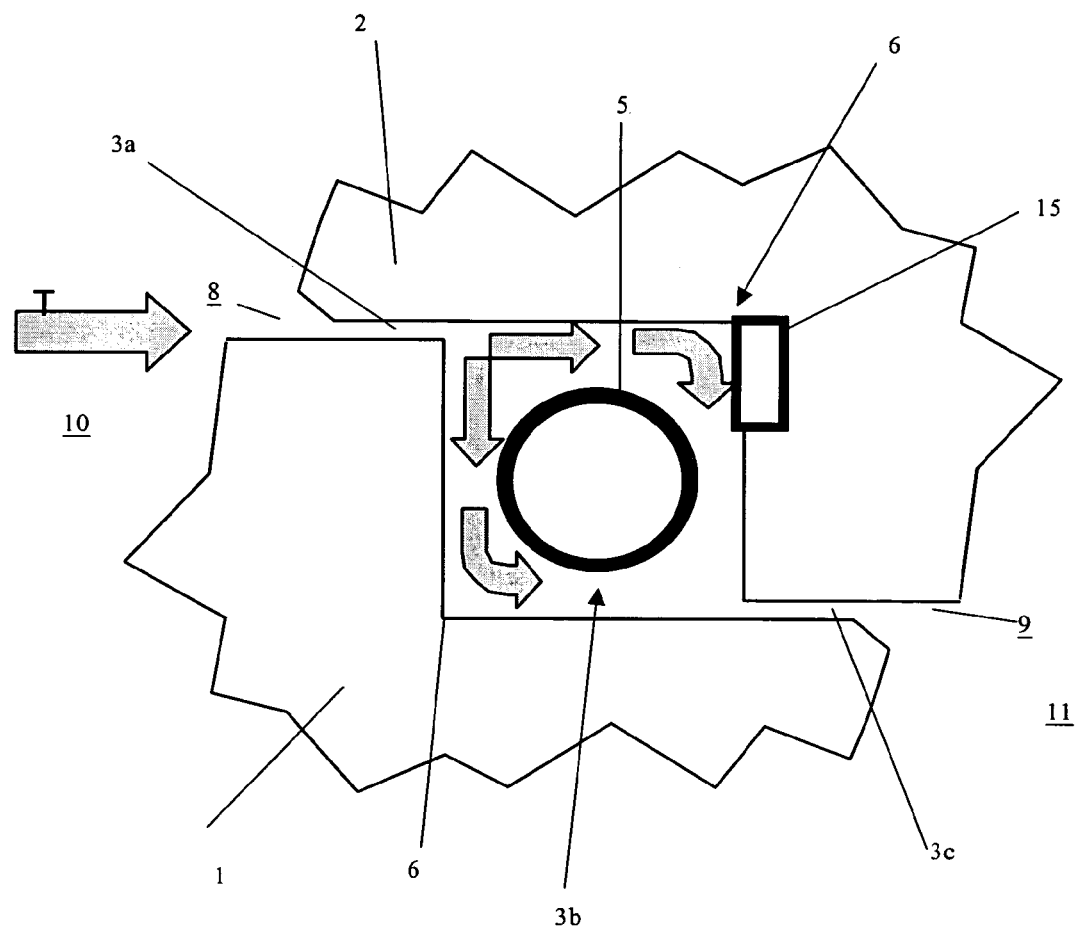
FIG. 2 shows an exemplary embodiment of a sealing assembly of the present invention.

FIG. 2 shows a detail of a vacuum apparatus which includes a first part 1 and a second part 2 being mechanically decoupled from each other by a slit 3, which includes three consecutive slit parts 3a, 3b, 3c when viewed in a transversal slit direction T. A first end 8 of the slit 3 is in fluid connection with a first vacuum chamber 10. A second end 9 of the slit 3 is in fluid connection with a second vacuum chamber 11. The pressures in both vacuum chambers can be relatively low during use, for example, lower than about $10^{-3}$ mbar. Also, during use, the first vacuum chamber 10 may have, for example, a higher pressure than the second vacuum chamber 11. The slit 3 includes a sealing assembly for preventing particles to be transmitted from the first vacuum chamber 10 to the second vacuum chamber 11.

As is shown, the sealing assembly includes a vacuum pumping device which extends substantially along the full length of the slit 3, in the longitudinal slit direction perpendicular to the plane of the drawing. In the present embodiment, the vacuum pumping device includes a first particle absorbing element 5 and a second particle absorbing element 15. Both absorbing elements 5, 15 substantially extend in the longitudinal slit direction. Particles, flowing from the first slit end 8 towards the second slit end 9, can be absorbed by the absorbing elements 5, 15, so that such particles can not reach the second vacuum chamber 11 via the slot. Such particles may be, for example, atoms, molecules and/or larger particles. By applying a first and/or a second particle absorbing element 5, 15, the assembly can provide a very high level of slit dealing. However, it is clear that the slit 3 may also be sealed by applying only one of these two absorbing elements 5, 15, leading to a more simple construction.

The first absorbing element 5 may be, for example, a cryogenic tube. During use, the element 5 is cooled to a relatively low temperature, for example, 77K or lower, using a cooling fluid, in order to capture inbound particles. The cooling fluid may be supplied, for example, by an external refrigeration unit. However, other types of absorbing bodies may also be applied, for example, getter pumps, and elements including regeneratable getter material. The getter element can be, for example, re-activated by heating by applying an electrical current through the getter material or a respective getter material carrier.

The second absorbing element 15 is arranged in sight of the first of the transversal slit ends 8. The second absorbing element 15 can include, for example, getter material, a cryogenically cooled surface or such.

According to the invention, it is advantageous when the slit 3 is optically opaque, viewed in the transversal direction T, such that the first end 8 of the slit 3 is not visible from the second end 9 of the slit 3 and vice versa. In an embodiment, this is achieved by providing the slit 3 with two opposite bends 6. In an embodiment, the middle slit part 3b containing the bends 6 is wider than the two outer slit parts 3a, 3c which extend towards the transversal slit ends 8, 9. The middle slit part provides a longitudinal sealing chamber 3b in which the particle absorbing element 5 is provided. Particles may not travel directly in a straight line from the first slit end 8 to the second slit end 9 through the slit 3, but will first encounter the second particle absorbing element 15, and second, may be forced around the first particle absorbing element 5, as is shown by respective arrows.

Therefore, the possibility of direct molecular transmission through the slit 3 may be substantially precluded, thereby providing a high degree of slit sealing.

In an embodiment, the first absorbing element 5 extends substantially in the center of the sealing chamber 3b. The first absorbing element 5 may be connected, for example, to the first part 1 of the apparatus only, in particular by at least one connector, which is not shown in the drawing. In that case, vibrations caused by the flow of cooling fluid through the first absorbing element 5 may not transmitted to the second part 2 of the apparatus. However, one or more such absorbing elements may also be arranged at other locations, for example, along, near and/or integrated in the first part 1 and/or second part 2. The second absorbing element 15 may also be located on different positions, for example, on the first and/or second apparatus parts 1, 2.

As is shown, the vacuum pumping device 5, 15 may be arranged to leave the slit 3 at least partially open, viewed in the transversal slit direction T. Consequently, the pumping device 5, 15 does not form a mechanical coupling between the first and second apparatus parts 1, 2. Therefore, those two apparatus parts 1, 2 are very well isolated from each other by the slit 3.

The arrangement as shown in FIG. 2 may be used in a lithographic projection apparatus, that includes at least one vacuum chamber. The vacuum chamber contains a substrate holder for holding at least one substrate, a patterning device for patterning a projection beam of radiation according to a desired pattern, and a projection device for projecting the patterned projection beam of radiation onto a target portion of the substrate. At least a first part 1 of the apparatus and a second part 2 of the apparatus are mechanically decoupled from each other by at least one slit 3.

According to an embodiment, the slit 3 includes a sealing assembly for sealing the slit 3. The sealing assembly includes a sealing device that extends substantially in a longitudinal slit direction for at least partially preventing particle transmission in a transversal slit direction. The sealing device includes the vacuum pumping device 5, 15. Therefore, the first and second part 1, 2 of the apparatus are vibrationally isolated, while a proper sealing of the slit 3 can be achieved.

In an embodiment, a device manufacturing method is provided. The method includes providing at least one beam of radiation using a radiation system and providing at least one substrate in a vacuum environment. The substrate is at least partially covered by a layer of radiation sensitive material. The method also includes using a patterning device in a vacuum environment to endow the beam of radiation with a pattern in its cross-section, and using a projection device in a vacuum environment to project the patterned beam of radiation onto a target portion of the layer of radiation-sensitive material of the substrate. At least a second part 2 of the apparatus is mechanically decoupled from a first part 1 of the apparatus by at least one slit 3. The slit 3 is sealed by the sealing assembly that includes the sealing device that extends substantially in a longitudinal slit direction for at least partially preventing particle transmission in a transversal slit direction. The sealing device includes the vacuum pumping device 5, 15.

The first and second part 1, 2 are in vibrational isolation from one another, so that devices may be positioned and therefore be produced with high precision. For example, the vibrational isolated part may include or be attached to the projection device and/or the patterning device, which utilize the vibrational isolation for an accurate patterning and projecting of the radiation beam, respectively. Particularly, the second part 2 may be part of the projection device, for example, a metro frame which carries vibration sensitive projection optics and/or sensors. The first apparatus part 1 may be, for example, a base frame of the apparatus, or any part which is attached to the base frame, wherein the base frame is coupled to the environment of the apparatus. The slit 3 may be endless, viewed in the longitudinal slit direction, for example a cylindrical slit extending between the metro frame 2 and the base frame 1. The vacuum environments may be provided by one or more vacuum zones or chambers.

A desired sealing level of the slit 3 may be achieved by the vacuum pumping device 5, 15. Consequently, spreading of contamination via the slit 3 is restrained. In this case, the slit 3 may be, for example, in fluid connection with a first vacuum chamber, wherein the substrate is located, and a second vacuum chamber containing the projection and/or patterning device. Then, the second vacuum chamber and particularly the projection and/or patterning device may be maintained relatively free from contamination emanating from the first vacuum chamber. Therefore, long life-time of the projection optics and/or patterning device may be sustained. In that case, the functioning of the patterning device and/or projection device may be affected relatively little by such contamination.

Although the illustrative embodiment of the present invention has been described in greater detail with reference to the accompanying drawing, it is to be understood that the invention is not limited to that embodiment. Various changes or modifications may be effected by one skilled in the art without departing from the scope or the spirit of the invention as defined in the claims.

For example, the sealing assembly is suitable for utilization in different apparatus types, for example, any vacuum apparatus wherein a certain vibrational isolation is desired. The apparatus may be, for example, a semiconductor industry device, for example, an EUV, e-beam writing or X-ray lithography apparatus.

The slit 3a, 3b, 3c may be formed in different ways and of dimensions. The slit 3 may simply be optically opaque, when the slit 3 does not extend in a straight line between the first and second slit transversal end 8, 9, for example, by being provided with at least one bend or such. However, a transversally straight slit may also be made optically opaque, for example, by providing vacuum pumping device 5, 15 in sight of both slit transversal ends 8, 9 within a sealing chamber 3b of the slit. In that case, the vacuum pumping device 5, 15 block the view between the slit transversal ends 8, 9 directly.

The assembly may include one or more types of vacuum pumping devices. The vacuum pumping devices may include, for example, a cryopump, a particle absorbing element 15 and/or other types of vacuum pumping devices. The dimensions of the cooling surface of the cooling element may be relatively large compared to the mechanical gap 3.

The apparatus may include different vacuum zones 10, 11, for example, one vacuum chamber including a patterning device, one chamber including a projection device and one chamber including a substrate holder.

The inner surfaces of the slit 3 may have, for example, a relatively low emissivity $\epsilon$, for example, $\epsilon<0.1$. This may be advantageous when the pumping device includes a cryo-element, since such emissivity reduces heat transfer between the cryo-element and the two apparatus parts 1, 2.

The slit 3 may be provided with a closing device for mechanically closing the slit 3, for example, lids for covering one or both slit ends 8, 9. This may be useful, for example, during maintenance work in one of the vacuum chambers 10, 11.

The closing device of the slit 3 may also be provided by the first and second apparatus part 1, 2, for example, by moving the first apparatus part 1 and the second apparatus part 2 towards each other. In that case, it is advantageous when the two outer slit parts 3a, 3c have different widths, so that the movement of the apparatus parts 1, 2 leads to the closing of only one end 8, 9 of the slit, particularly the end of the narrowest outer slit part 3a, 3c. In case one of the slit ends 8, 9 is closed, the slit 3 may be cleaned, for example, using purge gas, to remove contamination from slit 3. The purge gas may create an additional barrier for contaminants to prevent transport of contaminants from one vacuum zone 10, 11 to the other vacuum zone 11, 10.

For example, in FIG. 2 when the left slit end 8 is closed, the slit 3 may be purged with a clean purge gas while contaminants are prevented from flowing from the second zone 11 to the first zone 10. On the other hand, when the right slit end 9 is closed, the slit 3 may be purged with a purge gas while contaminants are prevented from flowing from the first zone 10 to the second zone 11.

While specific embodiments of the invention have been described above, it will be appreciated that the invention may be practiced otherwise than as described. The description is not intended to limit the invention.

What is claimed is:

1. A sealing assembly for sealing a slit between two regions in a lithographic apparatus, the assembly comprising:
    a vacuum pumping device comprising at least one particle absorbing element, which substantially extends in a longitudinal slit direction for at least partially preventing particle transmission between said regions in a transversal slit direction.

2. A sealing assembly according to claim 1, wherein the slit extends between a first part and a second part of a vacuum apparatus for mechanically decoupling said first part and said second part from each other.

3. A sealing assembly according to claim 1 wherein said absorbing element is a cryogenic and/or getter element.

4. A sealing assembly according to claim 1, wherein said slit is optically opaque, when viewed in said transversal direction.

5. A sealing assembly according to claim 4, wherein said slit comprises at least one bend, when viewed in the transversal slit direction, wherein said vacuum pumping device is arranged in said bend.

6. A sealing assembly according to claim 1, wherein said vacuum pumping device is arranged in sight of at least one transversal slit end.

7. A sealing assembly according to claim 1, wherein said slit comprises at least one longitudinal sealing chamber containing said vacuum pumping device.

8. A sealing assembly according to claim 1, further comprising a closing device for mechanically closing said slit.

9. A sealing assembly according to claim 1, wherein a first vacuum chamber is located at one end of the slit and a second vacuum chamber is located at an opposite end of the slit.

10. A sealing assembly according to claim 1, wherein pressure in the first vacuum chamber is different than pressure in the second vacuum chamber.

11. A lithographic projection apparatus comprising:
a substrate support for supporting at least one substrate;
a patterning device for patterning a beam of radiation according to a desired pattern; and
a projection device for projecting said patterned beam of radiation onto a target portion of said substrate,
wherein at least a first part of the apparatus and a second part of the apparatus are mechanically decoupled from each other by at least one slit, and
a vacuum pumping device comprising at least one particle absorbing element, which substantially extends in a longitudinal slit direction for at least partially preventing particle transmission in a transversal slit direction.

12. A device manufacturing method comprising:
providing at least one beam of radiation using a radiation system;
providing at least one substrate in a vacuum environment, said substrate being at least partially covered by a layer of radiation sensitive material;
using a patterning device in a vacuum environment to endow said beam of radiation with a pattern in its cross-section; and
using a projection device in a second vacuum environment to project said patterned beam of radiation onto a target portion of the layer of radiation-sensitive material of said substrate,
wherein at least a second part of an apparatus is mechanically decoupled from a first part of the apparatus by at least one slit, wherein said slit is sealed by a sealing assembly that comprises a vacuum pumping device comprising at least one particle absorbing element that extends substantially in a longitudinal slit direction for at least partially preventing particle transmission in a transversal slit direction.

13. A method for manufacturing a device on a lithographic apparatus, the method comprising:
patterning a beam of radiation in a first vacuum chamber;
projecting the patterned beam of radiation onto a target portion of a layer of radiation-sensitive material on a substrate located in a second vacuum chamber, a longitudinal slit disposed between said first vacuum chamber and said second vacuum chamber; and
absorbing particles in said longitudinal slit with at least one particle absorbing element that extends substantially in a longitudinal slit direction to substantially seal said first and second vacuum chambers from one another.

14. A method according to claim 13, wherein pressure in the first vacuum chamber is different than pressure in the second vacuum chamber.

* * * * *